(12) United States Patent
Kimura (10) Patent No.: US 7,074,644 B2
(45) Date of Patent: Jul. 11, 2006

(54) METHOD OF MANUFACTURING THIN FILM ELEMENT, THIN FILM TRANSISTOR CIRCUIT SUBSTRATE, ACTIVE MATRIX DISPLAY DEVICE, ELECTRO-OPTICAL DEVICE, AND ELECTRONIC APPARATUS

(75) Inventor: Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 2 days.

(21) Appl. No.: 10/765,200

(22) Filed: Jan. 28, 2004

(65) Prior Publication Data
US 2005/0130344 A1 Jun. 16, 2005

(30) Foreign Application Priority Data
Jan. 28, 2003 (JP) .............................. 2003-019126

(51) Int. Cl.
H01L 21/44 (2006.01)
H01L 21/48 (2006.01)
H01L 21/50 (2006.01)
(52) U.S. Cl. ....................................... 438/106; 438/455
(58) Field of Classification Search ................ 438/106, 438/107, 149, 455, 458, 459, 460, 464
See application file for complete search history.

(56) References Cited

U.S. PATENT DOCUMENTS

| 5,981,036 | A | * | 11/1999 | Schulz-Harder et al. . 428/195.1 |
| 6,261,881 | B1 | * | 7/2001 | Yamazaki et al. ........... 438/161 |
| 6,372,608 | B1 | | 4/2002 | Shimoda et al. |
| 6,521,511 | B1 | | 2/2003 | Inoue et al. |
| 2003/0047732 | A1 | * | 3/2003 | Yamazaki et al. ............ 257/59 |

FOREIGN PATENT DOCUMENTS

| JP | A 11-39440 | 2/1999 |
| JP | A 11-282995 | 10/1999 |
| JP | A 2001-282423 | 10/2001 |
| JP | A 2001-282424 | 10/2001 |
| JP | A 2002-311858 | 10/2002 |

(Continued)

OTHER PUBLICATIONS

S. Utsunomiya et al., Low Temperature Poly-SI TFT-LCD Transferred onto Plastic Substrate Using Surface Free Technology by Laser Ablation/Annealing (SUFTLA®), Asia Display/IDW '01, pp. 339-342.

Primary Examiner—Phuc T. Dang
(74) Attorney, Agent, or Firm—Oliff & Berridge, PLC (57) ABSTRACT

The present invention provides an electronic circuit in which functional elements are formed on a first substrate, wiring lines are formed on a second substrate, element chips including at least one functional element are peeled from the first substrate and transferred onto the second substrate, and the second substrate is curved, a thin film transistor circuit substrate in which a thin film transistor is used as the functional element in the electronic circuit, and an active matrix display device in which the thin film transistor is used as an active matrix device in the thin film transistor circuit substrate. In cases where it is desirable to obtain a flexible electronic circuit substrate, a flexible thin film transistor circuit substrate, or a flexible active matrix display device by forming the second substrate or the wiring lines to be curved, the element chip is not peeled from the second substrate and is not split. The element chips are rectangular, and the short sides of the element chips are arranged along the curving direction of the second substrate.

2 Claims, 8 Drawing Sheets

FOREIGN PATENT DOCUMENTS

| | | |
|---|---|---|
| JP | A 2002-314052 | 10/2002 |
| JP | A 2002-314123 | 10/2002 |
| JP | A 2002-343944 | 11/2002 |
| JP | A 2002-368282 | 12/2002 |
| JP | A 2003-77940 | 3/2003 |
| JP | A 2003-133708 | 5/2003 |
| JP | A 2003-258210 | 9/2003 |
| TW | 360901 | 6/1999 |
| TW | 382820 | 2/2000 |

* cited by examiner

FIG.1

Related Art

FIG.2

Related Art

METHOD OF MANUFACTURING THIN FILM ELEMENT, THIN FILM TRANSISTOR CIRCUIT SUBSTRATE, ACTIVE MATRIX DISPLAY DEVICE, ELECTRO-OPTICAL DEVICE, AND ELECTRONIC APPARATUS

BACKGROUND OF THE INVENTION

1. Field of Invention

The present invention relates to a method of manufacturing a thin film element which uses a technique of transferring the thin film element, such as a functional element, between the substrates, a thin film transistor circuit, an active matrix display device having the thin film transistor circuit, an electro-optical device, and an electronic apparatus.

2. Description of Related Art

In a related art electronic circuit that includes functional elements, such as thin film transistors or organic electroluminescent elements, wiring lines between the functional elements and a supporting substrate, the functional elements can be a part of the entire circuit, and the remaining part of the entire circuit includes wiring lines and a supporting substrate. In a manufacturing process of such an electronic circuit, where the functional elements, wiring lines, and the supporting substrate are manufactured as one body by the same manufacturing process, a highly complicated manufacturing process is required in order to create the functional element having high performance. Accordingly, the manufacturing cost thereof is expensive.

However, it does not require the highly complicated manufacturing process for only the wiring line and the supporting substrate, and the manufacturing cost thereof is also inexpensive. If the functional element is manufactured by a process separated from the process of forming the wiring line and the supporting substrate and is placed only on the required portion of the substrate, the overall manufacturing cost of the electronic circuit may be reduced.

A related art electronic circuit includes functional elements formed on a first substrate, wiring line formed on a second substrate, and element chips including at least one functional element peeled from the first substrate to be transferred onto the second substrate. A thin film transistor circuit in which the functional element in the electronic circuit is the thin film transistor, and an active matrix display device uses the thin film transistor in the thin film transistor circuit as an active matrix device.

According to this method, since the functional element may be placed only on the required portion therein, the overall manufacturing cost of the electronic circuit, the thin film transistor circuit, or the active matrix display device may be reduced. Additionally, as the peeling and transferring process, laser ablation and adhesive can be used (for example, as disclosed in T. Shimoda et al, Techn. Dig. IEDM 1999, 289, S. Utsunomiya et al, Dig. Tech. Pap. SID 2000, 916, T. Shimoda, Proc. Asia Display/IDW '01, 327, S. Utsunomiya et al, Proc. Asia Display/IDW '01, 339).

Figure 1:
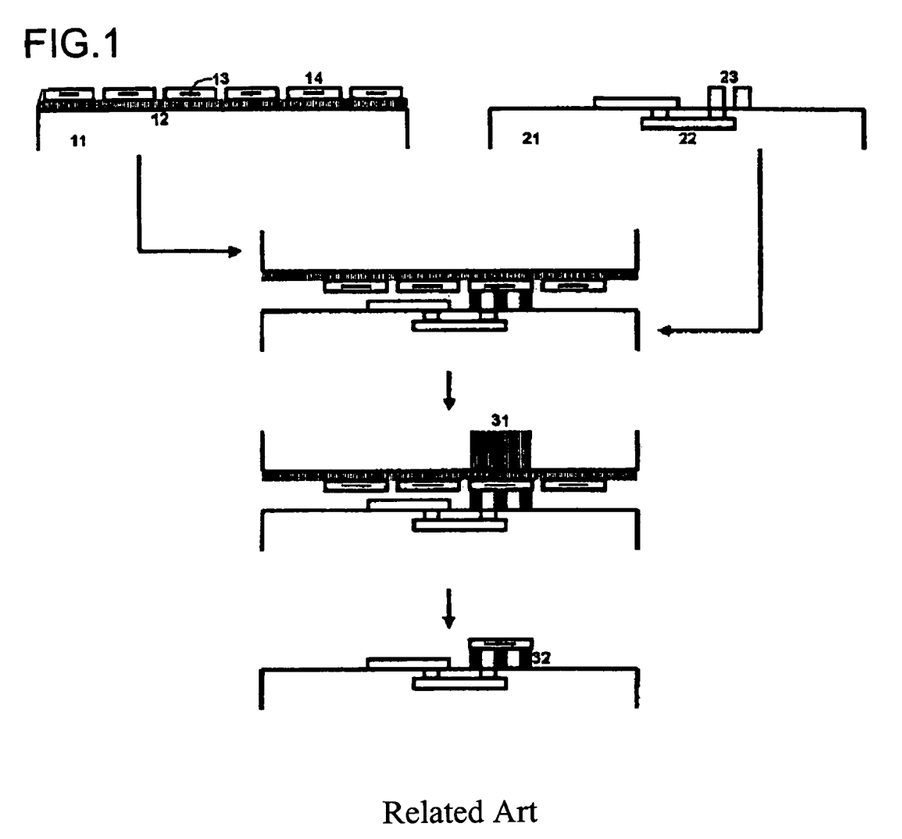
FIG. 1 is a schematic that shows a peeling and transferring process.

FIG. 1 shows a peeling and transferring process. A functional element 13 is formed on a first substrate 11 through a peel layer 12. A wiring line 22 and a pad 23 are formed on a second substrate 21. An element chip 14 having at least one functional element 13 is peeled from the first substrate 11 by a laser ablation method in which laser 31 is irradiated to the peel layer 12. An adhesive 32 is previously applied on the second substrate 21, and then the element chip 14 is transferred onto the second substrate 21.

Figure 2:
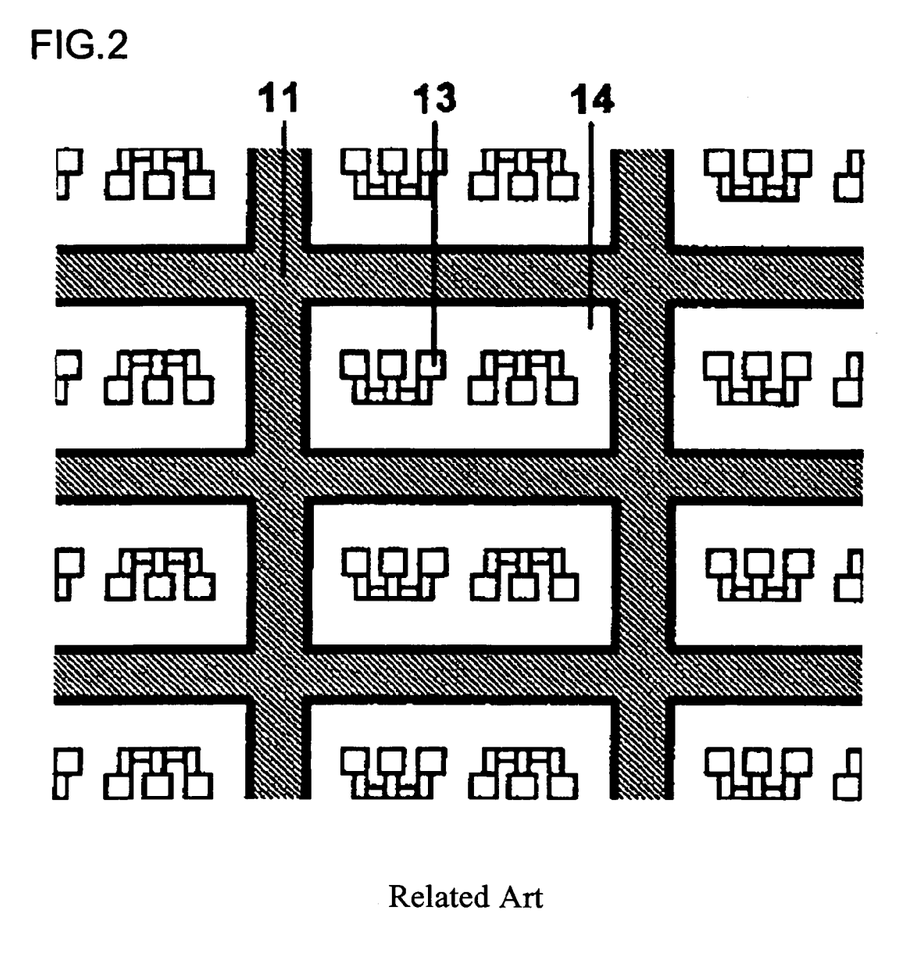
FIG. 2 is a plan view of an element chip.

FIG. 2 is a plan view of the element chip. The element chip 14 is rectangular, and is positioned on the first substrate 11.

SUMMARY OF THE INVENTION

In the thin film circuit manufactured by peeling the element chip having at least one functional element from the first substrate and transferring it onto the second substrate which is practically usable as a substrate, the second substrate is often curved when used.

If the wiring line or the second substrate which may be curved is formed in order to fit the used shape, a flexible electronic circuit, a flexible thin film transistor circuit or a flexible active matrix display device may easily be obtained.

However, in this case, when the second substrate is curved, there is a problem in that the element chip may be peeled from the second substrate or may be split.

Accordingly, the present invention provides a thin film circuit, an electronic circuit, a thin film transistor circuit or an active matrix display device, in which the element chip is not peeled from the second substrate and is not split.

In order to address or solve the above, the present invention provides a method of manufacturing a thin film element including: transferring element chips including at least one of a plurality of functional elements formed on a first substrate onto a second flexible substrate. The element chips are rectangular. The short sides of the element chips are arranged along the curving direction of the second substrate.

In the substrate mounted with the element chip manufactured by the above-mentioned method, the element chips are hardly peeled from the second substrate or are hardly split as compared with a case where the long sides of the element chips are arranged along the curving direction of the second substrate.

Also, in the present invention, it is preferable that the functional element is a thin film transistor, and in this case, the thin film transistor circuit substrate having the above-mentioned effect is provided.

Further, in the present invention, an active matrix display device, in which the thin film transistor is used as the active matrix device in the above thin film transistor circuit substrate, is provided.

According to the thin film transistor circuit substrate of the present invention, the active matrix display device having the above-mentioned effect may be obtained.

In addition, in the present invention, an electro-optical device, and an electronic apparatus mounted with the thin film transistor circuit substrate manufactured by the method of manufacturing the thin film element according to the present invention, are provided.

Additionally, the present invention is effective even in case where the peeling and transferring process of the element chip is performed by a different method.

BRIEF DESCRIPTION OF THE DRAWINGS

FIGS. 3A and 3B are schematics that show an electronic circuit according to the present invention in which the short side of the element chip is arranged along the curving direction of the substrate, where

FIGS. 4A and 4B are schematics that show an electronic circuit of a comparative example of the present invention in which the long side of the element chip is arranged along the curving direction of the substrate, where

DETAILED DESCRIPTION OF PREFERRED EMBODIMENTS

An exemplary embodiment of the present invention is further illustrated with examples below. Also, a series of aspects concerning the transferring method is disclosed in Japanese Patent Application Nos. 2001-282423 and 2001-282424 which are disclosed by this applicant.

First Exemplary Embodiment

In the method of manufacturing the thin film element according to the present invention, the same portion as that of the related art is described with reference to FIG. 1.

First, as shown in FIG. 1, the present invention is the same as the related art in that the functional element 13 formed on the first substrate is transferred onto the second substrate to form the thin film element.

A functional element 13 is formed on a first substrate 11 through a peel layer 12.

The peel layer has a property enabling it to absorb the irradiated light described, below in order to generate the peel in the layer and/or the interface thereof (hereinafter, referred to as in-layer peel or interface peel). Also, although the peel layer is formed on the entire first substrate 11, it is not limited to that configuration. For example, the peel layer 12 may be divided for every element chip. The peel layer 12 includes at least two layers each having a different composition or characteristic. In particular, it is preferable that the peel layer 12 include a light absorbing layer to absorb irradiated light and another layer having a composition or characteristic different from that of the light absorbing layer. Additionally, it is preferable that the other layer is a light-shielding layer (reflective layer) to shield irradiated light. This light-shielding layer is located on the opposite side of the incident direction of irradiated light with respect to the light absorbing layer to reflect or absorb irradiated light, and, therefore, performs the function of preventing or hindering irradiated light from penetrating into the layer to be transferred.

In the present exemplary embodiment, the reflective layer to reflect irradiated light may be formed as the light-shielding layer, on the side opposing the irradiated side of light with respect to the peel layer. The reflective layer which may reflect irradiated light, preferably with a reflectivity of at least 10%, and more preferably with a reflectivity of at least 30%, may be used. As such a reflective layer, a metal thin film composed of single layer or a plurality of layers, or an optical thin film composed of a laminated body of a plurality of thin films, each having a different refractive index, may be used. However, it is preferable that the metal thin film be mainly used since it is easily formed.

As the metal forming the metal thin film, for example, Ta, W, Mo, Cr, Ni, Co, Ti, Pt, Pd, Ag, Au, Al, or an alloy having at least one of the above can be used as main components. As a preferable additive element composing the alloy, for example, Fe, Cu, C, Si, or B can be used. By adding the additive element, heat conductivity or reflectivity may be adjusted. Also, in a case where the reflective layer is formed by a physical deposition method, it is advantageous in that a target may simply be manufactured.

Further, by alloying the metal, the material may be obtained more easily than the pure metal and the cost thereof is low. Additionally, the thickness of the reflective layer (light-shielding layer) is preferably about 10 nm to 10 μm, and more preferably about 50 nm to 5 μm, although not limited particularly. If the thickness is too large, forming the reflective layer is time consuming as is removing the reflective layer thereafter. Also, if the thickness is too small, the light-shielding effect according, to the film composition may be insufficient.

The light absorbing layer allows the peel layer to be peeled. The light absorbing layer absorbs irradiated light in order to eliminate or reduce the combining force between atoms or molecules of the material composing the light absorbing layer or to generate ablation in theory, and thus interlayer peel and/or interface peel is accomplished.

Also, by irradiating light, gas is emitted from the light absorbing layer, and thus the peel effect is often revealed. That is, there is a case where the component contained in the light absorbing layer becomes the gas to be emitted, or there is a case where the peel layer absorbs light to generate the gas in a moment and the gas is emitted to generate the peel.

The composition of the light absorbing layer is as follows:

① Amorphous silicon (a-Si).

Hydrogen (H) may be contained in amorphous silicon. In this case, the content of H is preferably about 2 at % or more, and more preferably about 2 to 20 at %. If H is contained therein in a predetermined amount, the hydrogen is emitted to generate internal pressure in the peel layer by irradiating light and the internal pressure causes the upper and lower thin films to be peeled off.

The content of H in amorphous silicon may be adjusted by appropriately setting the film forming condition, for example, gas composition, gas pressure, gas atmosphere, gas flow rate, temperature, substrate temperature, or injection power in a CVD method.

② Ceramic oxide, such as silicon oxide or silicate compound, titanium oxide or titanate compound, zirconium oxide or zirconate compound, lanthanum oxide, lanthanate compound, dielectric (ferroelectrics) or semiconductor. As silicon oxides, there are SiO, $SiO_2$, or $Si_3O_2$ can be used, and as silicate compounds, for example, $K_2SiO_3$, $Li_2SiO_3$, $CaSiO_3$, $ZrSiO_4$, and $Na_2SiO_3$ can be used.

As titanium oxide, TiO, $Ti_2O_3$, and $TiO_2$, can be used, and as titanate compounds, $BaTiO_4$, $BaTiO_3$, $Ba_2Ti_9O_{20}$, $BaTi_5O_{11}$, $CaTiO_3$, $SrTiO_3$, $PbTiO_3$, $ZrTiO_2$, $SnTiO_4$, $Al_2TiO_5$, and $FeTiO_3$ can be used.

As zirconium oxide, $ZrO_2$ can be used, and as zirconate compounds, $BaZrO_3$, $ZrSiO_4$, $PbZrO_3$, $MgZrO_3$, and $K_2ZrO_3$ can be used.

③ Ceramic or dielectric (ferroelectrics), such as PZT, PLZT, PLLZT or PBZT.

④ Ceramic nitride, such as silicon nitride, aluminum nitride, or titanium nitride.

⑤ Organic polymer material.

As organic polymer material, the combination of —CH—, —CH$_2$—, —CO-(ketone), —CONH-(amide), —NH-(imide), —COO-(ester), —N=N-(azo), —CH=N-(schiff) (combination thereof is divided by irradiation of light 7), and, particularly, any combination may be used if the number of the combination is plural. Concretely, polyolefin, such as polyethylene and polypropylene, polyimide, polyamide, polyester, polymethylmetacrylate (PMMA), polypenylenesulfide (PPS), polyestersulfone (PES), and epoxy resin can be used.

⑥ Metal.

As metal, for example, rare-earth metal, such as Al, Li, Ti, Mn, In, Sn or Y, La, Ce, Nd, Pr, Sm, Gd, and an alloy of at least one of them, can be used.

⑦ Hydrogen occlusion alloy.

As a concrete example, hydrogen occlusion alloys of rare-earth transition metal compounds, such as LaNi$_5$, and Ti based or Ca based occlusion alloy occluding hydrogen, can be used.

⑧ Nitrogen occlusion alloy.

As a concrete example, rare-earth irons, such as Sm—Fe based or Nd—Co based, rare-earth cobalt, rare-earth nikel, and rare-earth manganese compounds occluding nitrogen, can be used.

Additionally, the thickness of the light absorbing layer varies according to the peeling object, the composition of the peel layer, the construction of the layer, or the forming method, but it is preferably about 1 nm to 20 μm, more preferably 10 nm to 2 μm, and most preferably 40 nm to 1 μm.

If the film thickness of the light absorbing layer is too small, uniformity of the film is deteriorated and the peeling process is not uniformly performed. Also, if the film thickness is too large, the power of irradiated light (light amount) must be large in order to ensure good peeling and it is time-consuming to remove the peel layer. Also, it is preferable that the film thickness of the light absorbing layer be equal to that of the reflective layer.

Additionally, due to the reason mentioned above, the total thickness of the peel layer is preferably about 2 nm to 50 μm, and more preferably 20 nm to 20 μm.

The method of forming the layer composing the peel layer 12 is not specially limited, and is appropriately selected according to the condition, such as the film composition or the film thickness. For example, CVD (including MOCVD, low pressure CVD, and ECR-CVD method), deposition, molecular beam epitaxy (MB), sputtering, ion plating, various types of vapor deposition, such as PVD, electric plating, immersing plating (dipping), various plating methods, such as an electrophoreses plating, a Langmuir-Blodget (LB) method, a coating method, such as a spin coating method, a spray coating method and a role coating method. Various printing methods, a transferring method, an ink jet method, a powder jet method, and a combination of at least two of the above-mentioned methods, can be used. Also, the method of forming the light absorbing layer may be equal to or different from that of the reflective layer. This is appropriately selected according to the composition thereof.

For example, in a case where the composition of the light absorbing layer is amorphous silicon (a-Si), a CVD process, in particular, a low pressure CVD or a plasma CVD process is preferably employed.

Also, in a case where the light absorbing layer is composed of ceramic or organic polymer material according to sol-gel method, a coating method, in particular, a spin coating method is preferably employed.

Further, it is preferable that the reflective layer composed of the metal thin film be formed by deposition, molecular beam epitaxy (MB), laser ablation deposition, sputtering, ion plating, or various plating methods.

Also, each layer forming the peel layer 12 may be formed by at least two processes (for example, a layer forming process and a heating process).

The wiring line 22 and the pad 23 are formed simultaneously on the second substrate 21 during the process of forming the peel layer or by a separate process.

Further, the element chip 14 including at least one functional element 13 is peeled from the first substrate 11 by laser ablation in which laser 31 is irradiated to the peel layer 12. An adhesive 32 is previously applied on the second substrate 21, and the element chip 14 is transferred onto the second substrate 21.

Also, the wiring line 22 and the pad 23 are formed on the second substrate 21 by the process separated from the process of forming the element chip 14 including at least one functional element and the peel layer 12 on the first substrate.

The second substrate 21 formed previously with the wiring line 22 and the pad 23 may be separately prepared.

Figure 3A:
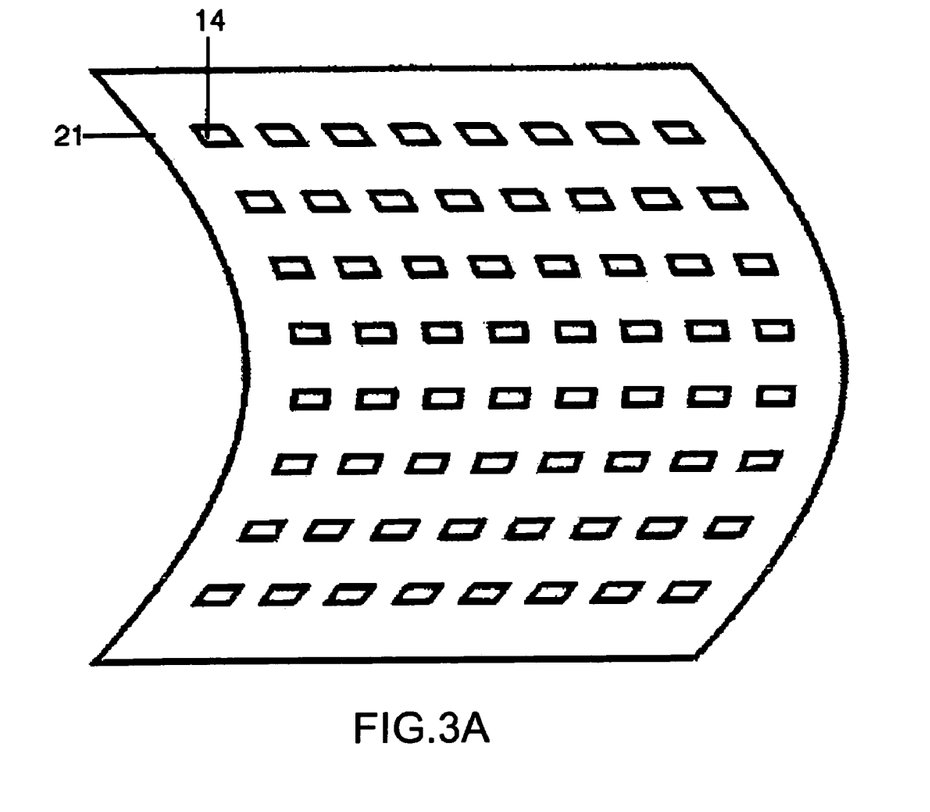
FIG. 3A is a perspective view thereof.
Figure 3B:
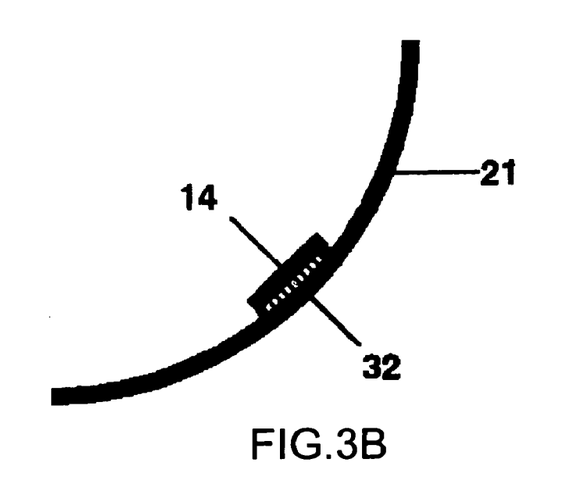
FIG. 3B is an enlarged view of the attached portion of the substrate and the element chip.

FIGS. 3A and 3B show an electronic circuit according to an exemplary embodiment of the present invention in which the short side of the element chip is arranged along the curving direction of the substrate, where FIG. 3A is a perspective view thereof, and FIG. 3B is an enlarged view of the attached portion of the substrate and the element chip. The element chip 14 is rectangular, and the short side of the function chip 14 is arranged along the curving direction of the second substrate 21.

That is, since the contact length of the element chip 14 is relatively short with respect to the radius of curvature of the second substrate 21 by employing the above-mentioned structure, the element chip 14 is prevented from being peeled from the second substrate 21 or the element chip 14 is prevented from being split.

Figure 4A:
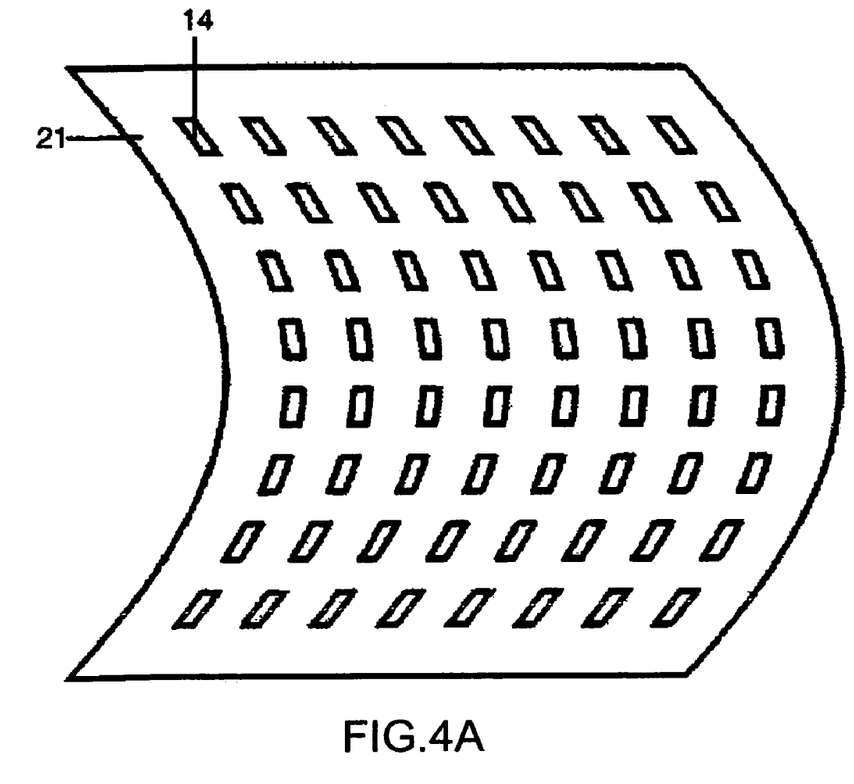
FIG. 4A is a perspective view thereof.
Figure 4B:
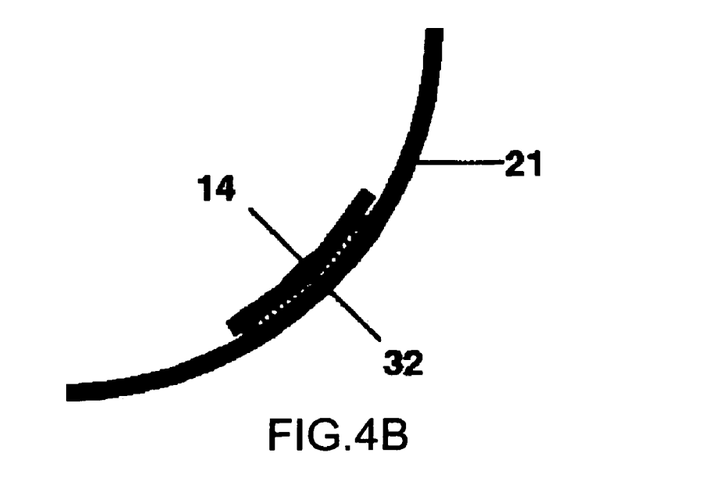
FIG. 4B is an enlarged view of the attached portion of the substrate and the element chip.

FIGS. 4A and 4B show an electronic circuit according to a comparative example of the present invention in which the long side of the element chip is arranged along the curving direction of the substrate, where FIG. 4A is a perspective view thereof, and FIG. 4B is an enlarged view of the attached portion of the substrate and the element chip.

In this structure, as shown in FIGS. 4A and 4B, since the contact length of the element chip 14 is long with respect to the radius of curvature of the second substrate 21, the element chip 14 may easily be peeled from the second substrate 21 or may be split.

(Application of the Functional Element Manufactured by Using the Present Invention)

Figure 5:
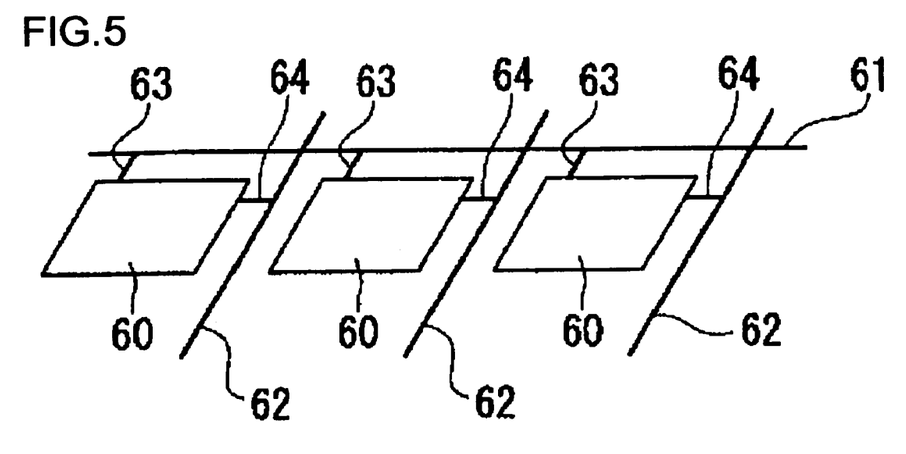
FIG. 5 is a schematic that shows a first aspect of application using the method of manufacturing the thin film element according to the present invention (a substrate having the thin film transistor circuit or an active matrix substrate)

FIG. 5 is a schematic showing a first aspect of application using the method of manufacturing the thin film element according to the present invention (a substrate having a thin film transistor circuit or an active matrix substrate).

In this exemplary embodiment, as shown in FIGS. 3A and 3B, an active matrix substrate is provided, in which the element chip is positioned on the substrate and a predetermined wiring line is formed on the substrate.

In this exemplary embodiment, various substrates for an electro-optical device, such as the active matrix substrate on which the wiring line composed of the conductive material and a circuit pattern are formed, are used as the resulting substrate. Also, the (functional) element 60 may use various circuit units, such as a shift register, a D/A converter, an SRAM, a DRAM, a current compensating circuit, IC, or LSI, in addition to TFT.

By electrically connecting the element 60 and the wiring lines 61, 62 previously formed on the resulting substrate, after transferring the element 60, the wiring lines 63, 64 composed of conductive material and formed after transferring of the element 60 may be formed by a method, such as a bonding method of the metal line, such as, for example, a gold line; a coating method of the conductive material, such as an ITO thin film or a metal thin film in which a resist film or a mask is combined with the thin film forming method, such as a sputtering method, a vapor deposition method, a CVD method or an electrophoreses plating; a printing method of applying a conductive solution in a predetermined location in which a metal conductor is formed by heating the substrate after applying; or an ink jet coating method using the conductive solution. Particularly, it is preferable to use a method in which the conductive solution is applied in a predetermined location according to the ink jet coating method and the substrate is heated to form a circuit composed of a metal conductor.

Also, the wiring lines 63, 64 may be formed before transferring the device 60, and, in this case, since the wiring lines 63, 64 may be formed by the same process as the process of forming the wiring lines 61, 62, the simplification of the process is accomplished.

Figure 6:
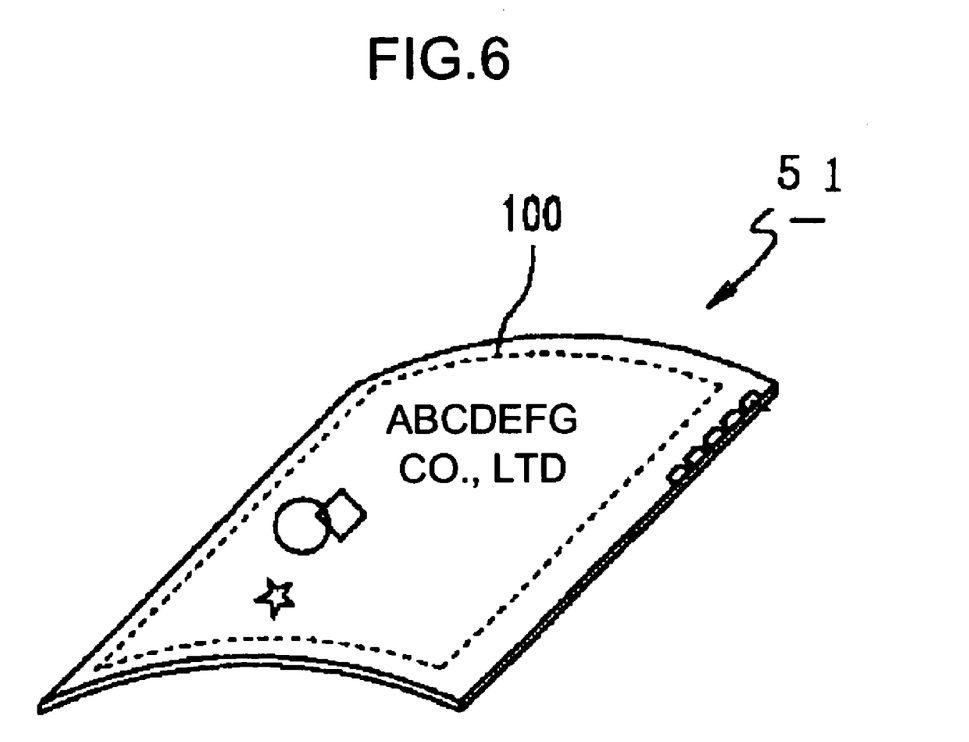
FIG. 6 is a schematic that shows a second aspect of application of the thin film element manufactured by using the present invention (electronic paper)

FIG. 6 is a schematic showing a second aspect of application of the thin film element manufactured by using the present invention (electronic paper).

Figure 7A:
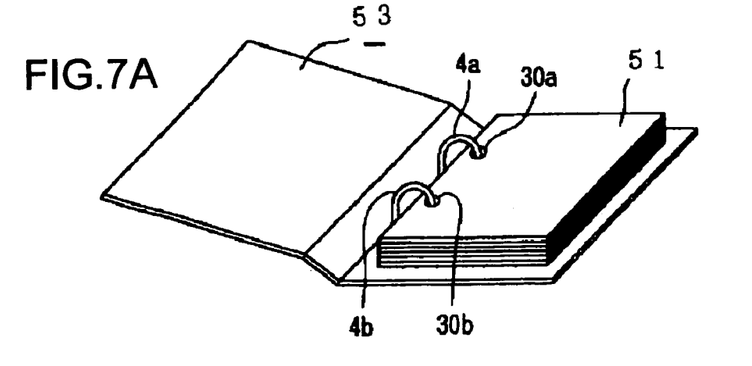
FIGS. 7A–7D are schematics that show a second aspect of application of the thin film element manufactured by using the present invention (electronic book)

For example, the substrate formed with the functional chip shown in FIGS. 3A and 3B may be applied as an electronic paper. Also, the electronic paper according to the present invention may be applied as, for example, an electronic book. That is, a binder type electronic book may be accomplished by filing many sheets of the electronic paper 51 in a binder which is a case. The shape of the binder type electronic book is shown in FIG. 7A. In this figure, many sheets of electronic papers 51 are filed in a binder 53 which is the case. In this case, through-holes 30a, 30b are formed in each filed electronic paper 51 and rod-shaped magnetic bodies 4a, 4b provided in the binder 53 are inserted into the through-holes 30a, 30b. Both ends of the rod-shaped magnetic bodies 4a, 4b are attached to the binder 53, and the middle portion thereof may be divided. In a state where the middle portion thereof is divided, the electronic paper 51 may freely be removed from the binder 53. That is, the rod-shaped magnetic bodies 4a, 4b may be formed so that the divided middle portion thereof may freely be opened or closed and a magnetic close loop is formed upon mounting the electronic paper 51.

Figure 7B:
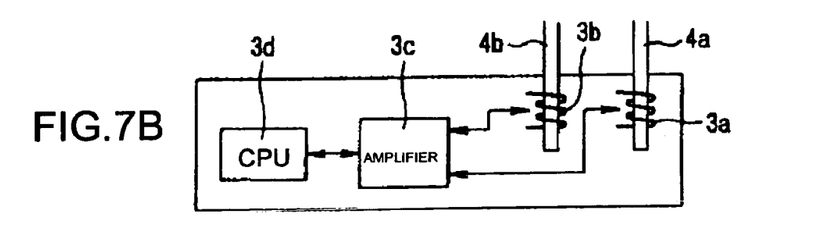

As shown in FIG. 7B, the binder 53 includes control coils 3a, 3b provided in correspondence with the rod-shaped magnetic bodies 4a, 4b, an amplifier 3c to supply current to the control coils 3a, 3b, and a CPU 3d to control the amplifier 3c.

Figure 7C:
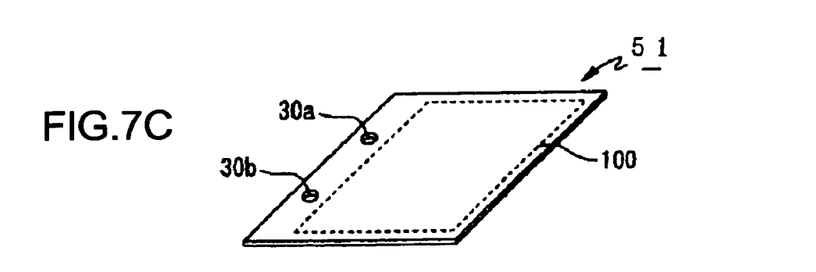
Figure 7D:
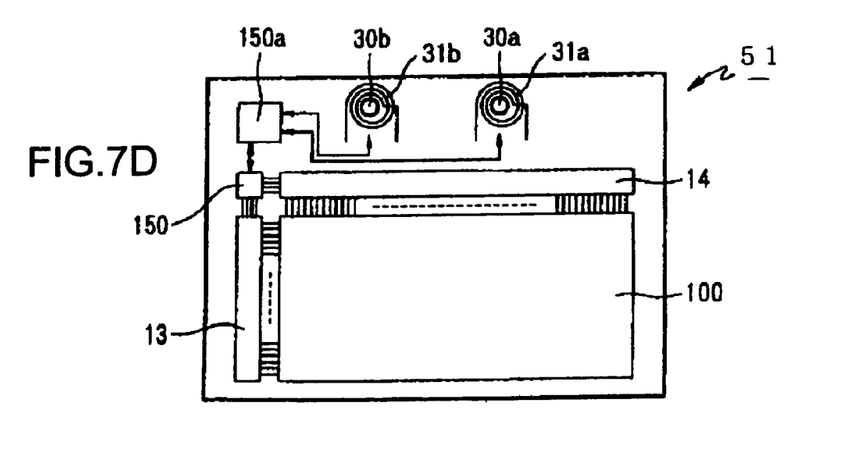

As shown in FIG. 7C, the electronic paper 51 has a display area 100, and through-holes 30a, 30b provided in the location corresponding to the rod-shaped magnetic bodies 4a, 4b at the outside of the display area 100. The electronic paper 51 is shown in more detail in FIG. 7D. Loop coils 31a, 31b are built-in around the through-hole 30a, 30b, and the center of the loop coil penetrates the through-hole as shown in this figure. These loop coils 31a, 31b are connected with an amplifier 150a and the current generated in the loop coils 31a, 31b is transmitted to the amplifier 150a. The amplifier 150a transmits data about the content to be displayed to a non-contact data communication integrated circuit 150. The integrated circuit 150 drives and controls a scan driver area 13 and a data driver area 14. Thereby, desired data is displayed on the display area 100.

As mentioned above, the electronic paper 51 of this exemplary embodiment has the loop coils 31a, 31b and a non-contact terminal composed of the through-holes 30a, 30b which penetrate the center of the loop coils and thus signal transmission/reception and a power supply may be accomplished by the non-contact terminal. Two through-holes and two loop coils are shown in FIGS. 7A to 7D, respectively, but one or more of each may be provided.

On the other hand, on the binder 53, rod-shaped magnetic bodies 4a; 4b corresponding to the through-holes 30a, 30b of the electronic paper 51 are provided and the rod-shaped magnetic bodies 4a, 4b penetrates the through-holes 30a, 30b, and thus accomplishing the read and conveyance thereof Since the control coils 3a, 3b are wound on the rod-shaped magnetic bodies 4a, 4b, the power supply and the signal transmission/reception is accomplished by the magnetic force from the case to the electronic paper generated by using the electronic induction between the control coil of the case and the loop coil in the filed electronic paper. The power supply and the signal transmission/reception of the non-contact terminal may use the technique disclosed, in, for example, Japanese Unexamined Patent Application Publication No. 11-039440. By including a specific ID code (identification code) to the transmitted/received signal, only the desired electronic paper, among many filed sheets of electronic papers, may be selected to update the content thereof.

In the binder type electronic book, the print, the read, or the conveyance of the electronic paper may be accomplished by appropriately attaching or removing several sheets of electronic paper. Also, since the power supply and the signal transmission/reception are accomplished in a non-contact fashion, the electronic paper and the electronic book case do not require an exposed terminal, and, accordingly, the binder type electronic book having excellent flexibility, reliability, and endurance may be provided.

Figure 8:
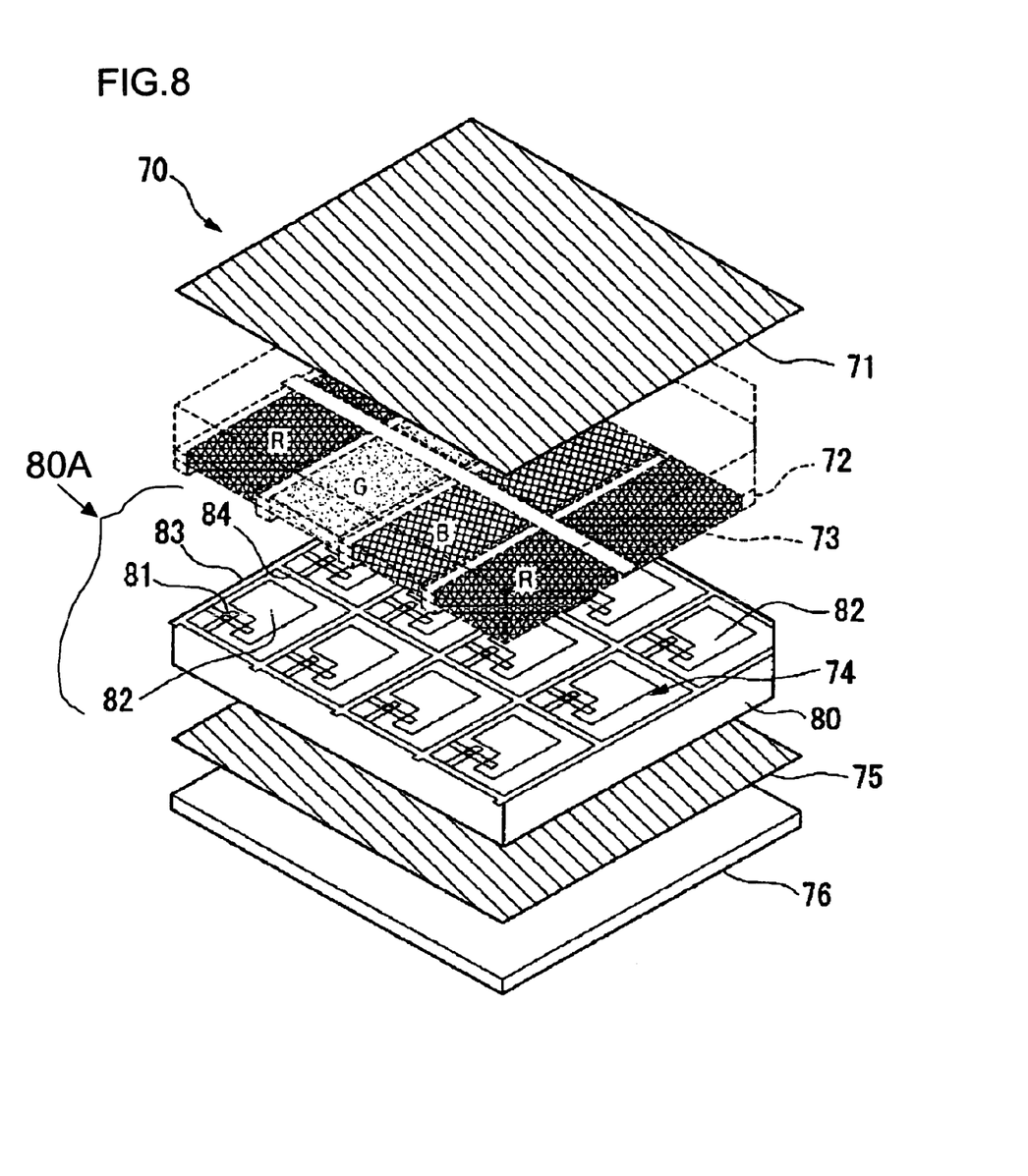
FIG. 8 is a schematic that shows a liquid crystal electro-optical device using the active matrix substrate according to the present invention.

FIG. 8 is a schematic showing a liquid crystal electro-optical device which is an example of the active matrix display device according to the present invention. This liquid crystal electro-optical device 70 includes an active matrix substrate 80, a color filter layer 73, and liquid crystal material provided in a space 74 between them as main components. The active matrix substrate 80 is provided with a polarization plate 75 located at the outside of a glass substrate, a driving circuit 80A therein, and an alignment film thereon (not shown). The color filter 73 is formed such that the polarization plate 71 located at the outside of the glass substrate 72, a black matrix, a RGB color filter layer, a overcoat layer, a transparent electrode, and the alignment film therein (not shown in detail) at the inside are laminated in sequence. The outside of the lower polarization plate 75 is provided with a backlight 76.

In addition, since the electro-optical device according to the present invention is manufactured by using the above-mentioned active matrix substrate according to the present invention, the cost thereof may be reduced and the quality thereof may be enhanced as compared with the electro-optical device manufactured by the related art active matrix substrate. Also, in this exemplary embodiment, although the liquid crystal electro-optical device, is illustrated as the active matrix display device, it is applicable to another electro-optical device such as an electrophoresis display device or an organic electroluminescent element. Further, according to the present invention, traceability to bend the substrate is enhanced by accurately placing fine elements on a predetermined location of the resulting substrate and an active matrix substrate having light-weight and strong bending durability may be provided by using the flexible substrate. In addition, an active matrix substrate having a curved surface, such as a curved display, may be provided.

Additionally, since these electro-optical devices are mounted on an electronic apparatus, such as a portable phone, the present invention may provide an electronic apparatus having the above-mentioned advantages.

What is claimed is:

1. A method of manufacturing element chips, comprising:

forming element chips including at least one of a plurality of thin film transistor circuits on a first substrate through a peel layer;

adhering a second flexible substrate onto the element chips through an adhesive layer;

transferring the element chips onto the second flexible substrate peeled from the first substrate, the element chips being rectangular; and arranging short sides of the element chips along a curving direction of the second substrate.

2. An electronic apparatus, comprising:

element chips including at least one of a plurality of the electronic apparatus; and the electronic apparatus including thin film transistor circuits manufactured by the method of manufacturing the element chips according to claim 1.

* * * * *